US006809797B2

(12) United States Patent
Baselmans et al.

(10) Patent No.: US 6,809,797 B2
(45) Date of Patent: Oct. 26, 2004

(54) LITHOGRAPHIC APPARATUS, DEVICE MANUFACTURING METHOD, AND DEVICE MANUFACTURED THEREBY (75) Inventors: Johannes Jacobus Matheus Baselmans, Oirschot (NL); Adrianus Franciscus Petrus Engelen, Eindhoven (NL); Hugo Augustinus Joseph Cramer, Eindhoven (NL); Jozef Maria Finders, Veldhoven (NL); Carsten Kohler, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/109,038

(22) Filed: Mar. 29, 2002

(65) Prior Publication Data
US 2002/0191165 A1 Dec. 19, 2002

(30) Foreign Application Priority Data
Mar. 30, 2001 (EP) ............................. 01303036

(51) Int. Cl.⁷ ........................ G02B 27/68; G02B 27/42
(52) U.S. Cl. ................................. 355/52; 355/53
(58) Field of Search .................... 355/52–53, 65, 355/67–71, 55; 356/399–401; 250/548

(56) References Cited
U.S. PATENT DOCUMENTS

| | | | | |
|---|---|---|---|---|
| 5,015,866 A | * | 5/1991 | Hayashi ...................... 250/548 |
| 5,444,538 A | | 8/1995 | Pellegrini ................... 356/401 |
| 5,805,273 A | * | 9/1998 | Unno ........................... 355/30 |
| 6,115,108 A | * | 9/2000 | Capodieci ..................... 355/77 |
| 6,172,373 B1 | * | 1/2001 | Hara et al. .................. 250/548 |
| 6,278,515 B1 | * | 8/2001 | Knight et al. ................. 355/55 |
| 6,278,957 B1 | * | 8/2001 | Yasuda et al. ............... 702/150 |
| 6,459,480 B1 | * | 10/2002 | Kye ............................ 356/124 |
| 6,461,778 B1 | * | 10/2002 | Holscher ...................... 430/30 |
| 6,493,063 B1 | * | 12/2002 | Seltmann et al. .............. 355/53 |

FOREIGN PATENT DOCUMENTS

WO    WO-00/31592    6/2000

OTHER PUBLICATIONS

European Search Report for Application No. 01303036.6–1240, dated Oct. 11, 2001.

* cited by examiner

Primary Examiner—Henry Hung Nguyen
(74) Attorney, Agent, or Firm—Pillsbury Winthrop LLP (57) ABSTRACT A device manufacturing method is disclosed in which the aberration of the projection system of a lithographic projection apparatus is obtained in terms of the Zernike expansion. The field distribution of displacement error and focal plane distortion of the projected image are calculated on the basis of the Zernike aberration and sensitivity coefficients which quantify the relationship between Zernike aberration components and the error in the image. A calculation is then performed to determine the compensation to apply to the apparatus in order to minimize the error in the image. The compensation is then applied to the apparatus. The compensation may comprise increasing one component of aberration of the apparatus in order to decrease the effect of another aberration, such that, on balance, the image quality as a whole is improved.

34 Claims, 2 Drawing Sheets

LITHOGRAPHIC APPARATUS, DEVICE MANUFACTURING METHOD, AND DEVICE MANUFACTURED THEREBY

This application claims priority from EP 01303036.6 filed Mar. 30, 2001, herein incorporated by reference.

FIELD

The invention relates generally to lithographic apparatus and more particularly to methods of providing compensation to correct lithographic errors.

BACKGROUND

In general, a lithographic projection apparatus comprises: a radiation system to supply a projection beam of radiation, a support structure for supporting patterning structure, the patterning structure to pattern the projection beam according to a desired pattern, a substrate table for holding a substrate, and a projection system for projecting the patterned beam onto a target portion of the substrate.

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning structure can comprise one or more programmable mirror arrays. More information on mirror arrays as here referred to can be gleaned, for example, from United States Patents U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT International Application No. WO 98/40791, incorporated herein by reference.

When performing imaging in a lithographic projection apparatus, despite the great care with which the projection system is designed and the very high accuracy with which the system is manufactured and controlled during operation, the image can still be subject to aberrations such as, for example, distortion (i.e. a non-uniform image displacement in the target portion at the image plane: the XY-plane), lateral image shift (i.e. a uniform image displacement in the target portion at the image plane), image rotation, asymmetric magnification, and focal plane deformation (i.e. a non-uniform image displacement in the Z-direction, for instance due to field curvature). Notice that, in general, image errors are not necessarily uniform, and can vary as a function of position in the image field. Distortion and focal plane deformation can lead to overlay and focus errors, for example overlay errors between different mask structures, and line-width errors. As the size of features to be imaged decreases, these errors can become intolerable.

Consequently, it is desirable to provide compensation (such as adjustment of the projection system and/or substrate) to correct for, or at least attempt to minimize, these errors. This presents the problems of first measuring the errors and then calculating appropriate compensation. Previously, alignment systems were used to measure the displacements in the image field of alignment marks. However, alignment marks typically consist of relatively large features (of the order of a few microns), causing them to be very sensitive to aberrations of the projection system. The alignment marks are unrepresentative of the actual features being imaged, and because the imaging errors depend inter alia on feature size, the displacements measured and compensations calculated did not necessarily optimize the image for the desired features.

Another problem occurs when, for instance because of residual manufacturing errors, the projection system features an asymmetric variation of aberration over the field. These variations may be such that at the edge of the field the aberration becomes intolerable.

A further problem occurs when using phase-shift masks (PSM's). Conventionally, the phase shift in such masks has to be precisely 180 degrees. The control of the phase is critical; deviation from 180 degrees is detrimental. PSM's, which are expensive to make, must be carefully inspected, and any masks with substantial deviation in phase shift from 180 degrees will generally be rejected. This leads to increased mask prices.

A further problem occurs with the increasing requirements imposed on the control of critical dimension ("CD"). The critical dimension is the smallest width of a line or the smallest space between two lines permitted in the fabrication of a device. In particular the control of the uniformity of CD, the so-called "CD uniformity", is of importance. In lithography, efforts to achieve better line width control and CD uniformity have recently led to the definition and study of particular error types occurring in features, as obtained upon exposure and processing (see description above). For instance, such image error types are an asymmetric distribution of CD over a target portion, an asymmetry of CD with respect to defocus (which results in a tilt of Bossung curves), asymmetries of CD within a feature comprising a plurality of bars (commonly referred to as Left-Right asymmetry), asymmetries of CD within a feature comprising either two or five bars (commonly known as L1–L2 and L1–L5, respectively), differences of CD between patterns that are substantially directed along two mutually orthogonal directions (for instance the so-called "H-V" lithographic error), and for instance a variation of CD within a feature, along a bar, commonly known as "C-D". Just as the aberrations mentioned above, these errors are generally non-uniform over the field. For simplicity we will hereafter refer to any of these error types—including the errors such as, for example, distortion, lateral image shift, image rotation, asymmetric magnification, and focal plane deformation—as "lithographic errors", i.e. feature-deficiencies of relevance for the lithographer.

Lithographic errors are caused by specific properties of the lithographic projection apparatus. For instance, the aberration of the projection system, or imperfections of the patterning structure and imperfections of patterns generated by the patterning structure, or imperfections of the projection beam may cause lithographic errors. However, also nominal properties (i.e. properties as designed) of the lithographic projection apparatus may cause unwanted lithographic errors. For instance, residual lens aberrations which are part of the nominal design may cause lithographic errors. For reference hereafter, we will refer to any such properties that may cause lithographic errors as "properties."

As mentioned above, the image of a pattern can be subject to aberrations of the projection system. A resulting variation of CD (for example, within a target portion) can be measured and subsequently be mapped to an effective aberration condition of the projection system which could produce said measured CD variation. A compensation can then be provided to the lithographic projection system such as to improve CD uniformity. A CD-control method such as described here comprises imaging a plurality of test patterns at each field point of a plurality of field points, a subsequent processing of the exposed substrate, and a subsequent CD measurement for each of the imaged and processed test patterns. Consequently, the method is time consuming and not suitable for in-situ CD control. With increasing demands on throughput (i.e. the number of substrates that can be processed in a unit of time) as well as CD uniformity, the control, compensation and balancing of lithographic errors must be improved, and hence, there is the problem of furthering appropriate control of properties.

SUMMARY

At least one embodiment of the present invention includes a device manufacturing method comprising: providing a substrate that is at least partially covered by a layer of radiation-sensitive material; providing a projection beam of radiation using a radiation system; using patterning structure to endow the projection beam with a pattern in its cross-section; projecting the patterned beam of radiation onto a target portion of the layer of radiation-sensitive material using a projection system; obtaining information on properties of at least one of the substrate, the layer of radiation sensitive material, the projection beam, the patterning structure and the projection system; obtaining a plurality of coefficients which quantify the relationship between said properties and at least one of a plurality of lithographic errors causing anomaly in a projected image in the radiation sensitive layer; defining a merit function which weighs and sums lithographic errors; calculating a compensation to apply to at least one of the substrate, the projection beam, the patterning structure and the projection system to optimize the merit function; and applying the calculated compensation.

According to at least one embodiment of the invention, there is provided a lithographic projection apparatus comprising: a radiation system for providing a projection beam of radiation; a support structure for supporting patterning structure, the patterning structure serving to pattern the projection beam according to a desired pattern; a substrate table for holding a substrate; a projection system for projecting the patterned beam onto a target portion of the substrate; compensation means applicable to at least one of a holder for holding the patterning structure, the substrate table, the radiation system, the patterning structure and the projection system, to optimize a merit function which weighs and sums lithographic errors causing anomaly in a projected image in the radiation sensitive layer; and a processor for calculating at least one compensation to be applied by said compensation means on the basis of a plurality of coefficients which quantify the relationship between at least one lithographic error and properties of at least one of the patterning structure, the projection system, the radiation sensitive layer on the substrate and the projection beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

DETAILED DESCRIPTION

Although preferably all lithographic errors shall be minimized, this will in general not be possible since there are not enough compensators available. Therefore, it is useful to define a merit function which suitably describes the quality of the imaging process in terms of a sum of weighted lithographic errors. A weight assigned to a lithographic error shall be indicative of the relative importance of that lithographic error. Compensation can be used to optimize (i.e. to minimize the value of) the merit function, such as to optimize the imaging and the resulting lithographic process. As explained above, lithographic errors depend on properties (of the lithographic projection apparatus) and can be calculated using, for instance, commercially available lithography simulation software such as Prolith™, Solid-C™ or LithoCruiser™. For instance, given specific (critical) pattern features to be imaged, given specific pattern errors (such as phase errors with a phase shift mask), given the aberration of the projection system, given the data concerning the radiation sensitive layer on the substrate, and given the radiation beam properties such as radiation energy and wavelength (i.e. given a set of properties), predictions regarding CD uniformity or feature-specific deficiencies can be made with these simulation programs. By introducing small variations of the properties (for instance, by introducing small variations of the projection lens aberration) and calculating the corresponding changes in the lithographic errors, coefficients quantifying the relationship between a lithographic error and said properties can be established. Obtaining information on properties comprises (in-situ) measuring of properties. For example, the actual aberration condition of the projection system can be measured in-situ using a suitable technique such as one of those disclosed in European Patent Application Number EP 1 128 217 A2 and in P. Venkataraman, et al., "Aberrations of steppers using Phase Shifting Point Diffraction Interferometry", in *Optical Microlithography XIII*, J. Progler, Editor, Proceedings of SPIE Vol. 4000, 1245–1249 (2000). An advantage of the method according to the present invention is that the method does not necessarily comprise the step of processing an exposed substrate.

Key to the control of lithographic errors is the ability to compensate, or at least affect, these lithographic errors. Any means enabling such control will be referred to hereafter as compensation means. By the term "compensation" mentioned above any change of a property caused by activating a compensation means is meant, and we will use the term compensation in this sense hereafter. Compensation means suitable for use with a lithographic projection apparatus are, for instance, means enabling a fine positioning (an X-, Y-, and Z-translation, and a rotation about the X-, Y-, and Z-axis) of the holder for holding the patterning structure, means enabling a similar fine positioning of the substrate table, means to move or deform optical elements (in particular, to fine position, using an X-, Y-, and Z-translation/rotation, optical elements of the projection system), and, for instance, means to change the energy of the radiation impinging on the target portion. However, suitable compensation means are not limited to said examples: for instance, means to change the wavelength of the radiation beam, means to change the pattern, means to change the index of refraction of gas-filled spaces traversed by the projection beam, and means to change the spatial distribution of the intensity of the radiation beam may also serve to affect lithographic errors.

The optimization calculation is based on varying the available compensations. The calculation comprises minimization of the merit function. Since the merit function is available as a mathematical expression (relating lithographic errors to compensations), standard minimization routines such as a "weighted least squares optimization" can be used to find a set of compensations at which the merit function has a minimum.

By performing the optimization calculation, the quality of the imaging can be objectively improved, as defined by the merit function. The compensation enables, for example, one component of aberration of the projection system to be increased in order to decrease the effect of another aberration component, such that, on balance, the image quality as a whole is improved. In other words, preferably the improvement in one aspect of the imaging more than compensates for a change of a different aspect of the imaging. According to another example, the patterning structure can be translated, rotated and/or tilted (a form of rotation) in order to minimize the overall local displacement of the image from its ideal position across the whole image field. In a further example, linear comatic aberration can be introduced within the projection system to reduce or eliminate left-right asymmetry caused by 3-wave aberration. In a further example, spherical aberration can be introduced to compensate for "Bossung tilt" caused by a phase shift error in a phase shift mask, which would otherwise have to be rejected. Bossung tilt is the lithographic error whereby at best focus position there is a gradient in the graph of exposed feature width against focus position (said graph being a so-called Bossung curve).

Said properties (of, for example, the projection system) can be stored in a database for use in optimization calculations for exposures using the apparatus containing that projection system. The coefficients which quantify the relationship between those properties and a lithographic effect can also be stored in a database as sets or families of coefficients depending on pattern feature type, size, orientation, illumination mode, numerical aperture and so on.

Figure 1:
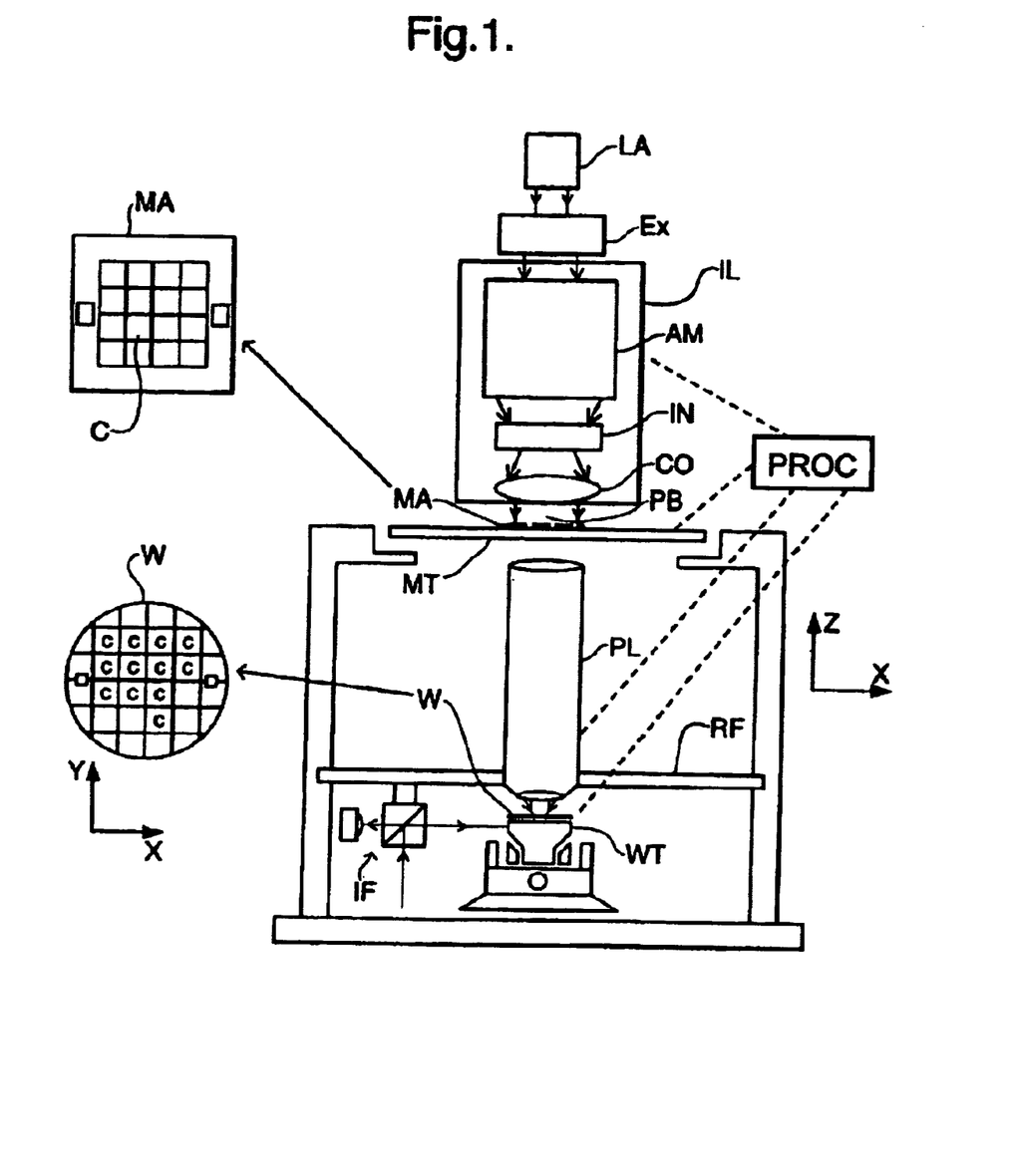
FIG. 1 depicts a lithographic projection apparatus according to an embodiment of the invention.

FIG. 1 schematically depicts a lithographic projection apparatus according to at least one embodiment of the invention. The apparatus comprises:

a radiation system Ex, IL, for supplying a projection beam PB of radiation (e.g. UV radiation such as for example generated by an excimer laser operating at a wavelength of 248 nm, 193 nm or 157 nm, or by a laser-fired plasma source operating at 13,6 nm). In this particular case, the radiation system also-comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The present invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The Depicted Apparatus can be Used in Two Different Modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

According to at least one embodiment of the present invention, the image distortion and focal plane deformation occurring in the projected image depend on various factors, such as the lens aberration, illumination mode used [e.g. numerical aperture (NA), pupil filling (sigma setting)], and the type and size of the feature imaged. The lens aberration can be expressed in terms of the Zernike expansion, in which the aberrated wavefront is given by the sum of a plurality of Zernike polynomials (functions of position in the image field) each multiplied by a respective Zernike coefficient. The image X, Y and Z displacements can be modeled by the following linear expressions:

$$dX(x,y) = \sum_j \frac{\partial X}{\partial Zj} \cdot Zj(x,y) \quad (1)$$

$$dY(x,y) = \sum_j \frac{\partial Y}{\partial Zj} \cdot Zj(x,y) \quad (2)$$

$$dF(x,y) = \sum_j \frac{\partial F}{\partial Zj} \cdot Zj(x,y) \quad (3)$$

where:
dX, dY, dF are the respective X, Y and Z displacements;
(x, y) is a specific field location;
j is an index for the jth Zernike aberration;
Zj is an aberration coefficient representative of the contribution of the jth Zernike polynomial to the wavefront aberration at field point (xy); and $$\frac{\partial}{\partial Z_j}$$

is the partial derivative of the displacement with respect to the jth Zernike aberration.

Notice that dX, dY and dF are lithographic errors, and that the coefficients $Z_j$ are properties (of the imaging system including an object and image plane).

A further refinement is to write the Z-displacement dF as two components dV and dH which are the optimal focus positions along the Z-axis for so-called vertical and horizontal lines, respectively; these are features extending along the y and x axes, respectively. Using this, and a different notation, the above equations can be rewritten, for the 37 Zernike aberrations, as:

$$dX(x,y)=A1.Z1(x,y)+A2.Z2(x,y)+ \ldots +A37.Z37(x,y) \quad (4)$$

$$dY(x,y)=B1.Z1(x,y)+B2.Z2(x,y)+ \ldots +B37.Z37(x,y) \quad (5)$$

$$dH(x,y)=C1.Z1(x,y)+C2.Z2(x,y)+ \ldots +C37.Z37(x,y) \quad (6)$$

$$dV(x,y)=D1.Z1(x,y)+D2.Z2(x,y)+ \ldots +D37.Z37(x,y) \quad (7)$$

where the partial derivatives have been replaced by equivalent sensitivity coefficients Ai, Bi, Ci, Di which express inter alia the effects of illumination mode, NA, sigma and pattern feature size and type.

The procedure according to at least one embodiment of the invention is as follows:

1. The intrinsic aberration of the lens is measured using a suitable technique, such as one of those disclosed in European Patent Application EP 1 128 217 A2, to obtain the Zernike coefficients (or previously measured values can be used). The Zernike coefficients are then multiplied by their respective Zernike functions to obtain a "field map" of the Zernike aberrations (Zj(x,y) in the above notation), which is stored. This information depends only on the lens and is independent of the illumination and features.

2. For the exposure of a specific pattern feature, at a particular illumination setting, the sensitivity coefficients Ai, Bi, Ci, Di are calculated using known computational techniques, such as image simulation software, for example the program known as Solid-C™ supplied by Sigma-C GmbH of Germany. Other suitable software packages, such as one known as Prolith™ or LithoCruiser™, may alternatively be used. These sensitivity coefficients do not depend on the field location, so only need to be calculated once per feature and illumnination setting combination, and are then stored in a database.

3. For the exposure of a specific pattern feature, at a particular illumination setting, the field distribution of the X, Y and Z-displacements is calculated by means of the models, for example equations (4) to (7), and using the field map from step 1 and the sensitivity coefficients from step 2. A calculation is performed to determine what compensation to provide to minimize the image displacements for the whole field. Such a calculation can be based on a merit function of the form $$S = w1 \sum_{x,y} (dX(x,y))^2 + w2 \sum_{x,y} (dY(x,y))^2 + w3 \sum_{x,y} (dH(x,y))^2 + w4 \sum_{x,y} (dV(x,y))^2 \quad (8)$$

where wi (i=1,2,3,4) are weights, and the sum over an appropriately chosen grid of field coordinates x,y ensures an averaging of the lithographic error over a target portion. The weights can be chosen at the discretion of the lithographer. For dX, dY, dH and dV one can sub stitute expressions (4), (5), (6) and (7) respectively. A simple compensator is, for instance, the Z-position of the substrate, commonly called "focus". It is well known that a change of focus, by moving the substrate through a distance dZ, affects primarily the value of Z4, and in this particular case, the effect is independent of the x,y position in the field. So, in order to incorporate the effect of the compensation dZ on the merit function (through the effects that dZ has on dX, dY, dH and dV), one has to substitute Z4+F4(dZ,x,y) for Z4 in the expressions (4), (5), (6) and (7), as used in equation (8), where the function F4(dZ,x,y) is simply given by $$F4(dZ,x,y)=a4 \cdot dZ \quad (9)$$

a4 being a (field independent) constant of proportionality which follows from aberration theory. Notice, however, that in practice the compensation dZ will, besides this primary impact on Z4, also affect, as a secondary error, other Zernike aberration coefficients. Generally, the effect of a compensation C comprises a primary error on a few Zemike coefficients and a secondary change of balance between the other Zernike aberration coefficients. So, the effect of a set of n compensations Ci, with i=1,2, . . , n, on the merit function can be visualized by replacing Zj(x,y) in the expressions (4), (5), (6) and (7), as used in equation (8), by Zj(x,y,C1, C2, ..., Ci, ..., Cn), where $$Zj(x, y, C1, C2, \cdots, Ci, \cdots, Cn) = Zj(x, y) + \sum_{i=1}^{n} Fj(Ci, x, y). \quad (10)$$

The functions Fj(Ci,x,y) are (to good approximation) linearly dependent on Ci and vanish for Ci=0. Therefore, to a good approximation one obtains:

$$Zj(x, y, C1, C2, \cdots, Ci, \cdots, Cn) \approx Zj(x, y) + \sum_{i=1}^{n} CiUji(x, y) \quad (11)$$

The constants of proportionality Uji(x,y) are defined by $$Uji(x, y) = \frac{\partial Fj(Ci, x, y)}{\partial Ci}, \quad (12)$$

and follow from the theory of aberrations or can be calculated using optical design software, such as for instance CodeV™. Notice that, in general, the constants of proportionality are field dependent. In the example above, a4 represents a special case where the constant of proportionality is field independent.

In view of the above, the merit function S depends on the compensations C1, C2, ... Cn. Then, using a standard minimization procedure such as a weighted least square optimization (see for instance the publication "Numerical Recipes in C", First Edition, by William H. Press, Brian P. Flannery, Saul A. Teukolsky, and William T. Vetterling, Cambridge University Press, 1988), values of the compensations can be found for which S is at a minimum value. Next, the projection apparatus is adjusted to provide the calculated compensation.

Examples of Available Compensations Include translation of the mask table (to shift the x, y co-ordinates);

lens adjustment (e.g. to change the magnification and/or field curvature, using internal lens-element manipulators and/or telecentricity adjustment);

rotation of the mask (reticle);

adjustment of the mask height (e.g. to compensate for $3^{rd}$ order distortion);

adjustment of the mask tilt; and adjustment of leveling (e.g. to compensate for z-displacement and tilt).

For a particular pattern to be imaged, the illumination setting to be used is usually predetermined to optimize contrast. Similarly, although the pattern may have many feature types, in practice one feature type will be the most critical. At step 2, the sensitivity coefficients can be calculated for the predetermined illumination setting and the most critical feature type. Alternatively, at step 2, a family of sets of sensitivity coefficients can be derived for a range of feature types and illumination settings and stored in a database. Then the set of sensitivity coefficients for a pattern, with particular most critical feature type and predetermined illumination setting, can simply be looked up in the database of coefficient families. The sensitivity coefficients, derived either way, can then be stored as the default values for that particular pattern. If the model of equations (4) to (7) is used there will only be 37×4 coefficient values associated with each pattern.

Figure 2:
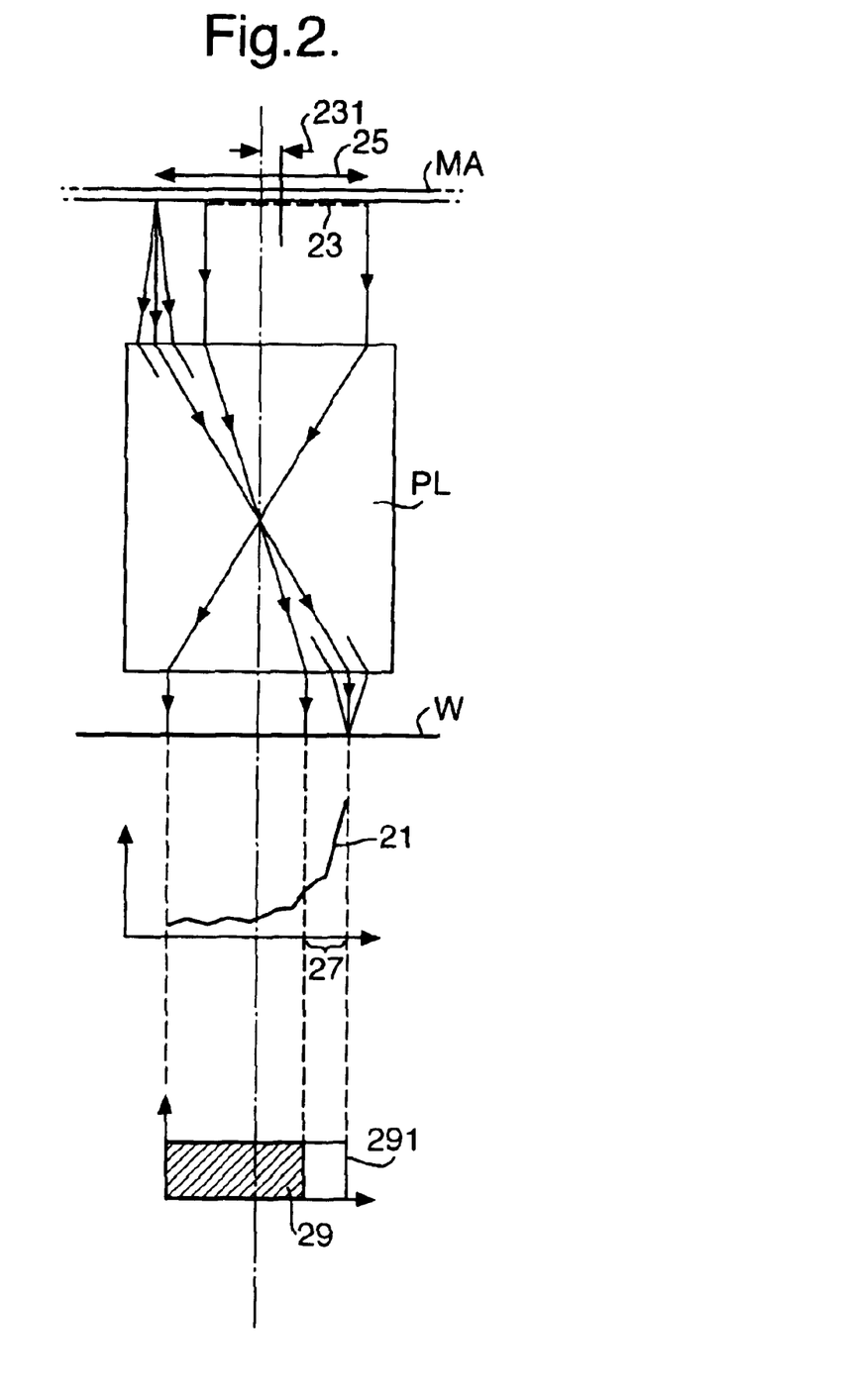
FIG. 2 depicts the imaging of a decentered pattern, where the decenter is the compensator for alleviating the effects of a lithographic error. The graph at the bottom shows the boundary of the area of x,y field points contributing to the merit function, in relation to the boundary of the full field target portion. The horizontal axis represents the x-position along the slit, the vertical axis represents the y-position (a position along the scanning direction). The graph in the middle shows a plot of a lithographic error, which is asymmetrically distributed along the x-axis. The horizontal axis represents the x-position along the slit, the vertical axis represents the magnitude of a lithographic error.

As described above, a translation of the mask table (holder for the patterning structure) is one of the compensations available. In one embodiment this translational degree of freedom is exploited to establish a decentered imaging of a pattern: see FIG. 2. A projection system PL of a scanning lithography apparatus is shown in FIG. 2 and is assumed to exhibit a strong asymmetric distribution 21 of, for instance, Z7 (x,y) along the x-direction. Such an asymmetry may be caused by residual manufacturing errors that occurred during the manufacturing of the projection system, and is known to be an important contributor to the lithographic error Left-Right asymmetry (LR asymmetry). If the pattern 23 that is to be imaged is smaller that the full field width 25, one can shift the pattern in the x-direction over a distance 231, such that the patterned beam traverses the projection system in a decentered manner. As a result, the portion 27 of the field which suffers strongly from Z7 is avoided, and the lithographic error LR asymmetry will be reduced. In this example, the merit function S will comprise a weighted term which accounts for LR asymmetry (with a weight w chosen by the lithographer):

$$S = \cdots + w \sum_{x,y} (LRasymmetry(x, y))^2 + \cdots \quad (13)$$

The compensation 231 affects, in this embodiment, the relative position of the boundary 29 of the grid of x,y field points (that contribute to the merit function) with respect to the boundary 291 of the full field target portion.

As described above, displacement-compensation means are used to minimize the X, Y and Z image displacements resulting from, for instance, aberration in the lens. Effectively the plane of the image and the wafer is shifted to balance aberration effects of the lens. Alternatively, or in addition, the aberration of the lens itself can be adjusted. For example, spherical aberration adjustment and comatic aberration adjustment can be provided (spherical and comatic aberration are the lowest order even and odd aberrations, respectively).

Aberration adjustment will influence the distribution of all aberrations (i.e. change the values of the Zernike coefficients), so will need to be taken into account at step 1. The means of adjusting the aberration may also influence the sensitivity coefficients Ai, Bi, Ci, Di, so may need to be taken into account in step 2. Lens manipulation primarily influences the low order Zernike aberrations (Z2, Z3, Z4, Z5). The impact of these aberrations on the imaging is displacement and defocus (astigmatism), and this impact is independent of the pattern feature structure and the illumination settings.

Often it is best simply to minimize the aberration of the lens. However, as can be seen from equations (4) to (7), the ability to adjust the aberrations Zj, gives more adjustable parameters, and hence more degrees of freedom, for minimizing the displacement errors.

At least one embodiment of the invention is not limited to reducing overlay and focus errors (minimizing the displacements). Compensation can be used to reduce any lithographic effect that is detrimental to image quality. For example left-right asymmetry (LR asymmetry) caused by 3-wave aberration can be reduced by introducing linear comatic aberration within the system. In other words, increasing one aberration can be used to decrease another aberration such that, on balance, the quality as a whole of a printed feature is improved. It is then necessary to include LR asymmetry in the merit function. Let us denote an arbitrary lithographic error, that is to be minimized, by $LE_j, j=1,2,3,4,\ldots$ For instance, we may rewrite Equation (8) as $$S = \sum_{j=1}^{4} wj(LEj)^2 \qquad (14)$$

if dX=LE1, dY=LE2, dH=LE3 and dV=LE4. One can now include LR asymmetry in the merit function with a weight w5, to be chosen by the lithographer:

$$S = \sum_{j=1}^{4} \left( wj \sum_{x,y} (LEj)^2 \right) + w5 \sum_{x,y} (LRasymmetry(x,y))^2, \qquad (15)$$

With simulation software one can calculate the sensitivity coefficients for the lithographic error W LRasymmetry(x,y) in analogy to equations (4)–(7), and proceed as described above. Another example of a lithographic error which can be compensated for is the error known as Bossung tilt (also known as "iso-focal tilt"). It may occur when a phase shift mask (PSM) is used as patterning structure. Ideally, the phase shift between the regions of the mask is precisely 180 degrees. Any deviation from 180 degrees phase shift will cause a Bossung tilt (i.e. even at the best focus position, there is a gradient in the graph of exposed feature width against focus position (Bossung curve); therefore the process latitude is very poor, and in practice one may have to discard the mask). However, it has been found that: (i) the phase error of a PSM; and (ii) spherical aberration (characterized by the Z9 Zernike parameter), have a similar impact on the Bossung curves, both leading to Bossung tilt. Therefore, a specific amount of spherical aberration can be introduced to cause Bossung tilt in one direction to cancel out a PSM phase error which causes Bossung tilt in the opposite direction. In this example, the merit function includes Bossung tilt, referred to hereafter as BT(x,y), which is a function of lens aberrations; in analogy with, for instance, equation (4) we may write $$BT(x,y) = P1Z1(x,y) + P2Z2(x,y) + \ldots + P9Z9(x,y) + \ldots + P37Z37(x,y) + \theta \qquad (16)$$

In this example, the sensitivity coefficient P9 is relatively large with respect to the other sensitivity coefficients $P_j, j=1,2,\ldots 8,10,\ldots,37$, θ is the PSM phase error, and Q is a sensitivity coefficient.

A compensation means which is known primarily to affect Z9 can now be used for counteracting the lithographic error Bossung tilt. If an optimal compromise between correcting for Bossung tilt, LR asymmetry, and the image shifts mentioned above is to be found, the merit function shall be chosen to be $$S = \sum_{j=1}^{4} wj \left( \sum_{x,y} (LEj)^2 \right) + w5 \sum_{x,y} (LRasymmetry(x,y))^2 + w6 \sum_{x,y} (BT(x,y))^2 \qquad (17)$$

While specific embodiments of the invention have been described above, it will be appreciated that the invention may be practiced otherwise than as described. The description is not intended to limit the invention.

What is claimed is:

1. A method of lithographic pattern transfer, said method comprising:

(a) obtaining a set of values that describes properties of elements of a lithographic apparatus configured to transfer a pattern onto a substrate, said properties including at least one nonideality of at least one among the group consisting of:
   (1) a radiation system,
   (2) an illumination system arranged to direct a beam from a radiation system onto a patterning structure,
   (3) a patterning structure arranged to pattern an incident beam according to the pattern, and
   (4) a projection system arranged to project a patterned beam;

(b) selecting a critical feature of the pattern;

(c) based on the set of values and a set of coefficients corresponding to the selected critical feature, obtaining a set of lithographic errors that characterize the quality of an image of the pattern in a cross-section of the patterned beam at a plurality of locations within the image (d) applying a compensation to change at least one of the set of values, including calculating the compensation to minimize a merit function based on the set of lithographic errors.

2. The method of lithographic pattern transfer according to claim 1, wherein said properties include at least one selected from the group consisting of pattern features, mask pattern errors, an aberration of the projection system, data concerning a radiation sensitive layer on the substrate, radiation beam energy and radiation beam wavelength.

3. The method of lithographic pattern transfer according to claim 1, wherein said set of lithographic errors includes at least one lithographic error selected from the group consisting of feature displacement in the X,Y-plane; feature rotation; asymmetric magnification of feature; distortion; focal plane deformation; asymmetric distribution of critical dimensions over a target portion; asymmetry of CD with respect to defocus; Left-Right asymmetries of critical dimensions; differences of critical dimensions between patterns that are substantially directed along two mutually orthogonal directions; variation of critical dimensions within a feature, along a bar; and combinations thereof.

4. The method of lithographic pattern transfer according to claim 1, wherein said set of coefficients comprises linear constants of proportionality between said properties and said lithographic errors.

5. The method of lithographic pattern transfer according to claim 1, wherein said set of coefficients is selected from a plurality of sets of coefficients, each set corresponding to a different element of at least one of the group consisting of (A) a set of different illumination settings, (B) a set of different settings of the projection system, and (C) a set of different features of the pattern to be projected.

6. The method of lithographic pattern transfer according to claim 1, wherein the process of obtaining comprises at least one of measuring; calculating; and reading from a database.

7. The method of lithographic pattern transfer according to claim 1, wherein said set of values comprises a field map of aberration as a function of position in an image to be formed at a target portion.

8. The method of lithographic pattern transfer according to claim 1, wherein said calculating includes increasing said nonideality with respect to a location of a plane parallel to at least one among an image plane of a projection system of the lithographic apparatus and an object plane of a projection system of the lithographic apparatus.

9. The method of lithographic pattern transfer according to claim 1, wherein the compensation comprises at least one of: translation of the patterning structure; rotation of the patterning structure; translation of the substrate; rotation of the substrate; movement or deformation of optical elements; change of energy of the radiation beam; change of wavelength of the radiation beam; change of index of refraction of at least one gas-filled space traversed by a beam of radiation; change of the spatial distribution of the intensity of the radiation; and change of used portion of image field.

10. The method of lithographic pattern transfer according to claim 1, wherein:

said set of values includes a field map of aberration of the projection system expressed in terms of the Zernike expansion;

said set of lithographic errors comprises at least one of the X displacement of the pattern; the Y displacement of the pattern; the Z displacement of features of the pattern oriented in the X direction; and the Z displacement of features of the pattern oriented in the Y direction, each as a function of position in the X, Y plane of a target portion of the substrate; and said set of coefficients includes constants of proportionality expressing sensitivities of the set of lithographic errors to the Zernike aberration components in said expansion.

11. The method of lithographic pattern transfer according to claim 1, wherein:

said merit function describes a left-right asymmetry of the pattern;

said set of coefficients relates the left-right asymmetry to a position of the pattern with respect to a full field of the projection system; and said compensation includes adjustment of the position of the pattern with respect to the full field of the projection system.

12. The method of lithographic pattern transfer according to claim 11, wherein said compensation comprises a shift of the pattern in the X direction, such that the patterned beam traverses the projection system in a decentered manner.

13. The method of lithographic pattern transfer according to claim 1, wherein:

said merit function describes a left-right asymmetry of the pattern;

said set of coefficients includes constants of proportionality expressing a sensitivity of the left-right asymmetry to aberration of the projection system; and said compensation includes adjustment of a linear comatic aberration of the projection system.

14. The method of lithographic pattern transfer according to claim 1, wherein:

said patterning structure comprises a phase shift mask;

said set of values comprises a phase shift error of the phase shift mask;

said merit function describes a Bossung tilt;

said set of coefficients includes constants of proportionality expressing a sensitivity of the Bossung tilt to the phase shift error and to an aberration of the projection system; and said compensation includes adjustment of the aberration of the projection system.

15. The method of lithographic pattern transfer according to claim 14, wherein said aberration of the projection system includes spherical aberration.

16. A device manufactured according to the method of claim 1.

17. A lithographic projection apparatus comprising:

a radiation system to provide a beam of radiation;

a support structure to support patterning structure, the patterning structure serves to pattern the beam according to a desired pattern;

a substrate table to hold a substrate that is at least partially covered by a layer of radiation-sensitive material;

a projection system to project the patterned beam onto a target portion of the layer of radiation-sensitive material;

a processor configured to obtain, based on a set of values and a set of coefficients corresponding to a selected critical feature of the pattern, a set of lithographic errors that characterize the quality of an image of the pattern in a cross-section of the patterned beam at a plurality of locations within the image, and to calculate a compensation to optimize a merit function based on the set of lithographic errors, the set of values describing properties including at least one nonideality of at least one of the group consisting of the patterning structure, the projection system, and the radiation system; and a compensator configured and arranged to apply the compensation to alter at least one of the set of values.

18. The lithographic projection apparatus according to claim 17, wherein said properties include at least one selected from the group consisting of pattern features, mask pattern errors, an aberration of the projection system, data concerning the radiation sensitive layer on the substrate, radiation beam energy, radiation beam wavelength and an index of refraction of at least one gas-filled space traversed by the radiation beam.

19. The lithographic projection apparatus according to claim 17, wherein said set of lithographic errors includes at least one selected from the group consisting of feature displacement in the X,Y-plane; feature rotation; asymmetric magnification of feature; distortion; focal plane deformation; asymmetric distribution of critical dimensions over a target portion; asymmetry of critical dimensions with respect to defocus; Left-Right asymmetries of critical dimensions differences of critical dimensions between patterns that are substantially directed along two mutually orthogonal directions; variation of critical dimensions within a feature, along a bar; and combinations thereof.

20. The lithographic projection apparatus according to claim 17, wherein said set of coefficients comprises linear constants of proportionality between said properties and said lithographic errors.

21. The lithographic projection apparatus according to claim 17, wherein said set of coefficients is selected from a plurality of sets of coefficients, each set corresponding to a different element of at least one of the group consisting of (A) a set of different illumination settings, (B) a set of different settings of the projection system, and (C) a set of different features of the pattern to be projected.

22. The lithographic projection apparatus according to claim 17, further comprising a database including at least one among the group consisting of said set of coefficients and said set of values.

23. The lithographic projection apparatus according claim 17, wherein said set of values comprises a field map of aberration as a function of position in an image to be formed at a target portion.

24. The lithographic projection apparatus according claim 17, wherein said compensator is configured to apply the compensation by increasing said nonideality with respect to a location of a plane parallel to at least one among an image plane of a projection system of the lithographic apparatus and an object plane of a projection system of the lithographic apparatus.

25. The lithographic projection apparatus according to claim 17, wherein the compensation comprises at least one of translation of the patterning structure; rotation of the patterning structure; translation of the substrate; rotation of the substrate; movement or deformation of optical elements; change of energy of the beam of radiation; change of wavelength of the beam of radiation; change of index of refraction of at least one gas-filled space traversed by the beam of radiation; change of the spatial distribution of the intensity of the radiation; and change of used portion of image field.

26. The lithographic projection apparatus according to claim 17, wherein:

said set of values comprises a field map of aberration of the projection system expressed in terms of the Zernike expansion;

said set of lithographic errors comprises at least one of the X displacement of the pattern; the Y displacement of the pattern; the Z displacement of features of the pattern oriented in the X direction; and the Z displacement of features of the pattern oriented in the Y direction, each as a function of position in the X, Y plane of a target portion of the substrate; and said set of coefficients includes constants of proportionality expressing sensitivities of the plurality of lithographic errors to the Zernike aberration components in said expansion.

27. The lithographic projection apparatus according to claim 17, wherein:

said merit function describes a left-right asymmetry of the pattern;

said set of coefficients relates the left-right asymmetry to a position of the pattern with respect to a full field of the projection system; and said compensation includes adjustment of the position of the pattern with respect to the full field of the projection system.

28. The lithographic projection apparatus according to claim 27, wherein said compensation comprises a shift of the pattern in the X direction, such that the patterned beam traverses the projection system in a decentered manner.

29. The lithographic projection apparatus according to claim 17, wherein:

said merit function describes a left-right asymmetry of the pattern;

said set of coefficients includes constants of proportionality expressing a sensitivity of the left-right asymmetry to aberration of the projection system; and said compensation includes adjustment of a linear comatic aberration of the projection system.

30. The lithographic projection apparatus according to claim 17, wherein:

said patterning structure comprises a phase shift mask;

said set of values comprises a phase shift error of the phase shift mask;

said merit function describes a Bossung tilt;

said set of coefficients includes constants of proportionality expressing a sensitivity of the Bossung tilt to the phase shift error and to an aberration of the projection system; and said compensation includes adjustment of the aberration of the projection system.

31. The lithographic projection apparatus according to claim 30, wherein said aberration of the projection system includes spherical aberration.

32. The lithographic projection apparatus according to claim 17, wherein the support structure comprises a mask table for holding a mask.

33. The lithographic projection apparatus according to claim 17, wherein the radiation system comprises a radiation source.

34. A method of using a patterning structure to endow a beam of radiation with a pattern in its cross-section and using a projection system to project the patterned beam onto a target portion of a layer of radiation-sensitive material that at least partially covers a substrate, said method comprising:

obtaining a characterization of an aberrated wavefront of the beam of radiation;

selecting a critical feature of the pattern;

calculating a compensation based on the characterization and a set of coefficients corresponding to the selected critical feature; and applying the compensation to at least one of a position of the image, a position of the substrate, a position of the patterning structure, a profile of the wavefront, a wavelength of the beam of radiation, a position of an element of the projection system, a shape of an element of the projection system, and an index of refraction of at least one gas-filled space traversed by the beam of radiation.

* * * * *

UNITED STATES PATENT AND TRADEMARK OFFICE
CERTIFICATE OF CORRECTION

PATENT NO. : 6,809,797 B2
DATED : October 26, 2004
INVENTOR(S) : Johannes J M Baselmans et al.

It is certified that error appears in the above-identified patent and that said Letters Patent is hereby corrected as shown below:

Column 12,
Line 29, delete entire paragraph and replace with
 -- As described above, a translation of the mask table (holder for the patterning structure) is one of the compensators available. In one embodiment this translational degree of freedom is exploited to establish a decentered imaging of a pattern: see Fig. 2 A projection system PL of a scanning lithography apparatus is shown in Fig. 2 and is assumed to exhibit a strong asymmetry may be cuased by redisual manufacturing errors that occurred during the manufacturing of the projection system, and is known to be an important controbutor to the lithogrphic error Left-Right asymmetry (LR aysmmetry). IF the pattern 23 that is to be imaged is smaller that the full field width 25, one can shift the pattern in the $x$-direction over a distance 231, such that the patterned beam traverses the projection system in a decentered manner. As a result, the portion 27 of the field which suffers strongly from Z7 is avoided, and the lithographic error LR asymmetry will be redued. In this example, the merit function S will comprise a weighted term which accounts for LR asymmetry (with a weight $w$ chosen by the lithographer):

$$S = \cdots + w \sum_{x,y} (LRasymmetry(x, y))^2 + \cdots \qquad (13)$$

The compensation 231 affects, inthis embodiment, the relative position of the boundary 29 of the grid of $x,y$ field points (that contribute to the merit function) with respect to the boundary 291 of the full field target portion. --

Signed and Sealed this

Nineteenth Day of April, 2005

JON W. DUDAS
*Director of the United States Patent and Trademark Office*